United States Patent [19]

Ikonen et al.

[11] Patent Number: 5,291,474

[45] Date of Patent: Mar. 1, 1994

[54] PROCEDURE FOR FORMING FREQUENCIES OF A DIGITAL RADIO TELEPHONE

[75] Inventors: Raimo Ikonen, Pertteli; Pekka Lonka; Pekka Mikkola, both of Salo, all of Finland

[73] Assignee: Nokia Mobile Phones Ltd., Salo, Finland

[21] Appl. No.: 875,545

[22] Filed: Apr. 27, 1992

Related U.S. Application Data

[63] Continuation of Ser. No. 512,789, Apr. 20, 1990, abandoned.

[30] Foreign Application Priority Data

May 18, 1989 [FI] Finland ................... 892405

[51] Int. Cl.$^5$ ................................. H04B 1/50
[52] U.S. Cl. ........................... 370/30; 455/77; 455/76
[58] Field of Search ............. 370/30, 29, 45.3; 455/73-77, 86, 85, 87, 88, 196

[56] References Cited

U.S. PATENT DOCUMENTS

| | | | |
|---|---|---|---|
| 4,186,343 | 1/1980 | Kakigi | 325/17 |
| 4,231,116 | 10/1980 | Sekiguchi et al. | 455/87 |
| 4,267,592 | 5/1981 | Craiglow | 370/29 |
| 4,317,221 | 2/1982 | Toya | 455/76 |
| 4,373,205 | 2/1983 | Mizota | 455/86 |
| 4,476,575 | 10/1984 | Franke et al. | 455/76 |
| 4,489,413 | 12/1984 | Richmond et al. | 370/30 |
| 4,513,447 | 4/1985 | Carson | 455/86 |
| 4,542,531 | 9/1985 | Fukumura | 455/86 |
| 4,588,453 | 12/1985 | Minken | 455/86 |
| 4,694,466 | 9/1987 | Kaolin | 370/29 |
| 4,703,520 | 10/1987 | Rozanski, Jr. et al. | 455/75 |
| 4,809,355 | 2/1989 | Drefahl | 455/86 |
| 4,825,448 | 4/1989 | Critchlow et al. | 375/56 |
| 4,903,257 | 2/1990 | Takeda et al. | 455/86 |
| 4,932,072 | 6/1990 | Toko | 455/76 |

FOREIGN PATENT DOCUMENTS 290412 11/1988 Japan .
1601710 12/1977 United Kingdom .

OTHER PUBLICATIONS

European Search Report completed Dec. 21, 1990, EP 903352983.

Primary Examiner—Douglas W. Olms
Assistant Examiner—Dang Ton
Attorney, Agent, or Firm—Darby & Darby

[57] ABSTRACT

A procedure is utilized for forming the transmission and reception frequencies required for the operation of a digital radio telephone based on time division multiplex access, in particular, in a radio telephone for the GSM system. According to the procedure, the mixer frequencies used in the transmitter and the receiver of the radio telephone are formed by a synthesizer and a basic oscillator commmon to both the receiver and transmitter. The clock frequency for the logic of the radio telephone and the RF reference frequency to the synthesizer are produced by dividing the output frequency of the common basic oscillator.

8 Claims, 1 Drawing Sheet

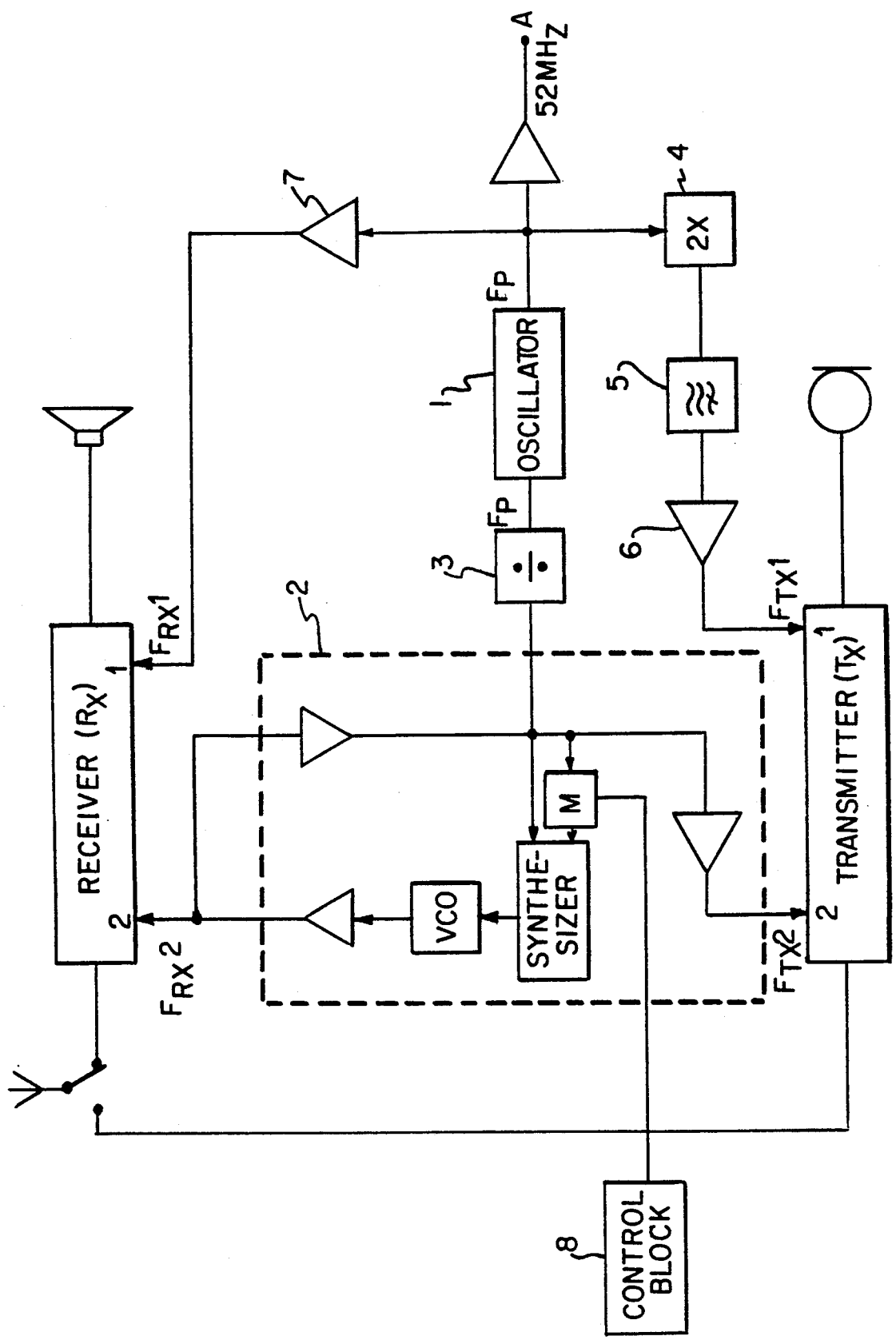

PROCEDURE FOR FORMING FREQUENCIES OF A DIGITAL RADIO TELEPHONE

This is a continuation of application Ser. No. 07/512,789, filed Apr. 20, 1990 now abandoned.

BACKGROUND OF THE INVENTION

The present invention relates to a procedure by which the transmission and reception frequencies required in a digital radio telephone based on time division multiplex access (TDMA), in particular, in a radio telephone for the Group Special Mobile (GSM) system can be formed.

As is known in the art, generally at least two frequency synthesizers are used to generate the frequencies required by the transmitter and the receiver of a radio telephone. These synthesizers generate stable local oscillator frequencies for the modulators of the transmitter and for the demodulators of the receiver. In these known radio telephones different oscillators are also used for forming the clock frequencies for the logic of the telephone and the reference frequency for the radio frequency signal. This arrangement is appropriate for use also in TDMA systems, for instance in the completely digital GSM system covering all Europe and scheduled to be adopted into use in the middle of the year 1991.

In analog radio telephones, e.g. in 900 MHz systems, it is well known in the art to use one synthesizer to form a mixer frequency, for transferring a received RF signal received thereby being transmitted to an intermediate frequency, and a mixer frequency, whereby the intermediate frequency of the transmitter is raised to the transmission frequency.

The frequencies of the above systems are e.g. as follows.

| Receiver: | receiving frequency | 935 to 960 MHz |
|---|---|---|
| | intermediate frequency | 50 MHz |
| | mixer frequency (local oscillator) | 985 to 1010 MHz |
| Transmitter: | transmission frequency | 890 to 915 MHz |
| | intermediate frequency | 95 MHz |
| | mixer frequency (local oscillator) | 985 to 1010 MHz |

As is noted, the difference between the intermediate frequencies, i.e. 45 MHz, is the same as the duplex interval of the system. Therefore, it is feasible to use only one synthesizer, whereby the mixer frequency generated is the same both for the transmitter and for the receiver. If the difference between the mixer frequencies were different from the duplex intervals, at least two synthesizers should be used. In a digital radio telephone in which the difference between the intermediate frequencies differs from the duplex interval, e.g. by 52 MHz, at least two synthesizers should be used for forming intermediate frequencies.

Using several synthesizers and oscillators in a digital radio telephone no doubt raises the manufacturing costs, requires more space on circuit boards, and increases the failure occurrence rate of the telephone.

SUMMARY OF THE INVENTION

The object of the invention is to eliminate the above mentioned drawbacks, and this is so implemented that the mixer frequencies required by the transmitter and the receiver of the digital radio telephone are produced for both of them by means of a common synthesiser and an oscillator, whereby also the clock frequency for the logic, and the RF reference frequency are produced.

The basis for the invention lies in the idea that since in a system based on time division multiplexing, the transmitter and the receiver operate in different time slots, the frequencies required thereby can be formed for the transmitter and the receiver by means of a common oscillator and a synthesizer.

BRIEF DESCRIPTION OF THE DRAWINGS

The procedure is described in more detail below with reference to the block diagram of the sole FIGURE in which only the most important blocks of operation required for understanding the procedure are presented.

DETAILED DESCRIPTION OF A PREFERRED EMBODIMENT

The reference clock frequency according to the specification of the GSM system is 13 MHz. Therefore, the frequency of the basic oscillator, i.e. 52 MHz, can appropriately be used for the basic frequency $f_p$ of the system because when it is divided by four the required reference frequency, i.e. 13 MHz is obtained. The basic oscillator is a voltage-controlled crystal oscillator.

From the basic oscillator 1 the clock frequency of the logic of the telephone is obtained by dividing the frequency $f_p=52$ MHZ to be derived from the output A by four. A first mixer frequency $f_{Rx1}$ of the demodulator of the receiver Rx and a first mixer frequency $f_{Tx1}$ of the transmitter Tx are also derived from the basic oscillator frequency $f_p$. The first mixer frequency $f_{Rx1}$ of the receiver Rx is the same as the basic oscillator frequency $f_p$ which is carried through a buffer 7 to the demodulator of the receiver, while the first mixer frequency (transfer oscillator frequency) $f_{Tx1}$ of the transmitter Tx is derived from the basic frequency $f_p$ by taking it through the frequency multiplier 4 (multiplying by two), the filter 5 and the buffer 6 to the modulator of the transmitter. The first mixer frequency of the transmitter is therefore a second harmonic frequency of the basic frequency $f_p$, i.e. 104 MHz. The difference of the intermediate frequencies is thus 52 MHz.

The required second mixer frequencies of the transmitter Tx and the receiver Rx are established from the basic frequency $f_p$ by the aid of a synthesizer 2. The synthesizer comprises, a manner known in the art, a voltage-controlled oscillator VCO, a phase comparator $\emptyset$ and requisite buffers. The inputs of the phase comparator $\emptyset$ are the divided frequency of the basic oscillator derived from the divider 3 and the frequency derived from the divider M. The input of the divider M is the frequency formed by the voltage-controlled oscillator VCO, which is thus the same as the frequency formed by the synthesizer 2. The divider M is controlled, by control block 8. The control block 8 instructs the divider M so that the frequency established by the synthesizer 2 can be selected. The synthesiser changes directly from one frequency to another without passing through the intermediate frequencies.

The system functions as follows. When a transmission period is in question, the synthesizer 2 generates a second mixer frequency $f_{Tx2}$ for the transmitter Tx, which is within the range of from 994 to 1010 MHz, depending on the transmission frequency. The first mixer frequency $f_{Tx1}$ (104 MHz) is obtained in the form of the second harmonic of the basic oscillator 1. When the transmission period ends and one moves to the receiving period, the synthesizer moves, controlled by the logic, at a frequency of 7 MHz downwards. The synthesizer is thus tuned to the receiving channel corresponding to the transmission channel into a second mixer frequency $f_{Rx2}$ of the receiver Rx, i.e. into the range of 987 to 1012 MHz. The logic of the radio telephone includes microprocessors and digital signal processors. The microprocessors provide common control of the radio telephone's other components as set forth in the GSM specifications. The first mixer frequency $f_{Rx1}$ (52 MHz) of the receiver Rx is derived from the basic oscillator. When the receiving period is over, the synthesizer is tuned again for 7 MHz upwards to wait for another transmission period.

The frequencies have been so selected that the mutual modulation, error response and error transmission properties would be as appropriate as possible. Since the same synthesizer generates the mixer frequencies of both the transmitter and the receiver in the form of time divisions, it needs to be very fast. This is feasible because the nonmodulated oscillator can be made to be fast.

The frequency distribution set forth is as follows:

| Receiver: | receiving frequency | 935 to 960 MHz |
|---|---|---|
| | 2nd mixer frequency | 987 to 1012 MHz |
| | intermediate frequency | 52 MHz + modulating frequency |
| | 1st mixer frequency (stable) | 52 MHz |
| Transmitter | 1st mixer frequency (transfer oscillator frequency, stable) | 104 MHz |
| | mixing frequency | 104 MHz + modulating frequency |
| | 2nd mixer frequency | 994 to 1019 MHz |
| | transmisson frequency | 890 to 915 MHz |

It is obvious that the procedure of the invention is not concerned with the frequencies as such, thus, they may also be different from the ones presented above. It is only essential that the second mixer frequencies are produced by means of one synthesizer common to the transmitter and the receiver, and the first stable mixer frequencies by one oscillator.

The procedure of the invention leads to a significant reduction in the number of components and thereby, to reduced material and maintenance costs. In addition, space saving on a circuit board enables manufacturing smaller and lighter telephones.

We claim:

1. The method of operating a transmitter and a receiver of a time division multiplex radio telephone having a logic control, said radio telephone being operated in a time division multiplex radio telephone system for transmitting and receiving radio frequency signals, using a single common basic oscillator having a basic oscillator frequency and a single common synthesizer comprising the steps of:

deriving a first receiver mixer frequency from said basic oscillator frequency, applying to said transmitter a first transmitter mixer frequency derived from said basic oscillator frequency, for mixing with a modulating signal for producing an intermediate transmitter frequency signal, said first transmitter mixer frequency being different from said first receiver mixer frequency, applying a third frequency derived from said basic oscillator frequency, to said common synthesizer, applying the output from said synthesizer as a second receiver mixer frequency to said receiver, for mixing with a received radio frequency signal for producing an intermediate receiver frequency signal, the second receiver mixer frequency being present at the receiver during a reception time slot of the time division multiplex system, applying the first receiver mixer frequency to the receiver, for mixing with the intermediate receiver frequency to produce a demodulated output signal, and applying the output from said synthesizer, as a second transmitter mixer frequency, to said transmitter, for mixing with the intermediate transmitter frequency for producing a transmitter radio frequency signal, the second transmitter mixer frequency being present at a transmitter during a transmission time slot of the time division multiplex system, and said second transmitter mixer frequency frequency being different from said second receiver mixer frequency.

2. The method in accordance with claim 1 further comprising the steps of:

using the basic oscillator frequency of said oscillator as the first receiver mixer frequency;

deriving the first transmitter mixer frequency from said basic oscillator frequency by multiplying the basic oscillator frequency by two; and deriving the third frequency by dividing said basic oscillator frequency by four.

3. The method in accordance with claim 1 further comprising the steps of:

a. generating the second transmitter mixer frequency during the transmission time slot;

b. decreasing a frequency of the synthesizer subsequent to the transmission time slot so as to be tuned to the receiving channel corresponding to the transmission frequency and generating throughout the receiving time slot said second receiver mixer frequency; and c. increasing the frequency of the synthesizer subsequent to the receiving time interval to wait for another transmission time slot.

4. The method in accordance with claim 1 further comprising the step of applying a fourth frequency derived from said basic oscillator frequency to the logic control of the time division multiplex system, the fourth frequency being a clock frequency for the logic control.

5. The method of claim 1, further comprising the steps of:

a. generating a first control signal from the logic control;

b. applying the first control signal to the synthesizer during the transmission time slot; and c. initiating the generation of the second transmitter mixer frequency by the synthesizer in response to the first control signal.

6. The method of claim 5, further comprising the steps of:

a. generating the second transmitter mixer frequency during the transmission time slot;

b. decreasing a frequency of the synthesizer subsequent to the transmission time slot so as to be tuned to the receiving channel corresponding to the transmission frequency and generating throughout the receiving time slot said second receiver mixer frequency; and c. increasing the frequency of the synthesizer subsequent to the receiving time interval to wait for another transmission time slot.

7. The method of claim 6, further comprising the steps of:

a. generating a second control signal from the logic control;

b. applying the second control signal to the synthesizer to initiate the decreasing of the synthesizer frequency.

8. The method of claim 7 wherein the synthesizer receives the first control signal after the receiving time slot.

* * * * *